(12) United States Patent
Kim et al.

(10) Patent No.: US 11,532,791 B2
(45) Date of Patent: Dec. 20, 2022

(54) LIGHT EMITTING DEVICE AND DISPLAY DEVICE INCLUDING THE SAME

(71) Applicant: SAMSUNG ELECTRONICS CO., LTD., Suwon-si (KR)

(72) Inventors: Tae Ho Kim, Seongnam-si (KR); Won Sik Yoon, Seoul (KR); Eun Joo Jang, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 288 days.

(21) Appl. No.: 16/791,163

(22) Filed: Feb. 14, 2020

(65) Prior Publication Data
US 2020/0266348 A1    Aug. 20, 2020

(30) Foreign Application Priority Data
Feb. 15, 2019   (KR) .................. 10-2019-0018226

(51) Int. Cl.
  *H01L 51/00* (2006.01)
  *C09K 11/06* (2006.01)
  *H01L 51/50* (2006.01)
  *H01L 51/56* (2006.01)

(52) U.S. Cl.
  CPC ............ *H01L 51/005* (2013.01); *C09K 11/06* (2013.01); *H01L 51/004* (2013.01); *H01L 51/0037* (2013.01); *H01L 51/0039* (2013.01); *H01L 51/0007* (2013.01); *H01L 51/502* (2013.01); *H01L 51/56* (2013.01)

(58) Field of Classification Search
  CPC .................................................. H01L 51/005
  See application file for complete search history.

(56) References Cited

U.S. PATENT DOCUMENTS

| | | | |
|---|---|---|---|
| 9,293,654 B2 | 3/2016 | Demir et al. | |
| 9,663,710 B2 | 5/2017 | Pillay Narrainen et al. | |
| 10,003,037 B2 | 6/2018 | Luchinger et al. | |
| 2017/0248748 A1 | 8/2017 | Satake et al. | |
| 2018/0033856 A1* | 2/2018 | Kwon .................... | C09K 11/02 |
| 2018/0044586 A1 | 2/2018 | Kwon et al. | |
| 2018/0119007 A1 | 5/2018 | Ippen et al. | |
| 2018/0148638 A1 | 5/2018 | Ahn et al. | |

(Continued)

FOREIGN PATENT DOCUMENTS

| | | |
|---|---|---|
| CN | 108913142 A | 11/2018 |
| CN | 109233801 A | 1/2019 |

(Continued)

OTHER PUBLICATIONS

US 10,703,967 B2, 07/2020, Ahn et al. (withdrawn)
Extended European Search Report dated Jul. 6, 2020, of the corresponding European Patent Application No. 20157462.1.

*Primary Examiner* — Douglas M Menz
(74) *Attorney, Agent, or Firm* — Cantor Colburn LLP

(57) ABSTRACT

A light emitting device including a first electrode and a second electrode facing each other, an emission layer disposed between the first electrode and the second electrode, wherein the emission layer includes a plurality of quantum dots and metal carboxylate having at least one hydrocarbon group of at least one carbon atoms, and the plurality of quantum dots includes a first organic ligand, and does not include cadmium and lead, and a method of manufacturing the same.

21 Claims, 4 Drawing Sheets

(56) References Cited

U.S. PATENT DOCUMENTS

2018/0151817 A1 5/2018 Cho et al.
2020/0172802 A1 6/2020 Ahn et al.

FOREIGN PATENT DOCUMENTS

| EP | 3327813 A1 | 5/2018 |
|----|------------|--------|
| KR | 20170074908 A | 6/2017 |
| KR | 20170092934 A | 8/2017 |
| KR | 20180019003 A | 2/2018 |
| KR | 20180059363 A | 6/2018 |

\* cited by examiner

LIGHT EMITTING DEVICE AND DISPLAY DEVICE INCLUDING THE SAME

CROSS-REFERENCE TO RELATED APPLICATION

This application claims priority to and the benefit of Korean Patent Application No. 10-2019-0018226 filed in the Korean Intellectual Property Office on Feb. 15, 2019, and all the benefits accruing therefrom under 35 U.S.C. § 119, the contents of which in its entirety is herein incorporated by reference.

BACKGROUND

1. Field

A light emitting device, in particular an electroluminescent device and a display device including the same are disclosed.

2. Description of the Related Art

Physical characteristics (e.g., energy bandgaps, melting points, etc.) of nanoparticles that are known intrinsic characteristics may be controlled by changing the particle sizes of the nanoparticles, unlike bulk materials. For example, semiconductor nanocrystals, also known as quantum dots, may be supplied with photoenergy or electrical energy and may emit light in a wavelength corresponding to sizes of the quantum dots. Accordingly, the quantum dots may be used as a light emitting device, in particular an electroluminescent device, that emits light of a particular wavelength.

SUMMARY

An embodiment provides an electroluminescent device having an emission layer including a combination or a mixture of a metal carboxylate and quantum dots.

Another embodiment provides a display device including the luminescent device.

A light emitting device according to an embodiment includes a first electrode and a second electrode facing each other and an emission layer disposed between the first electrode and the second electrode, wherein the emission layer includes a plurality of quantum dots and a metal carboxylate having at least one hydrocarbon group of at least one carbon atoms and the plurality of quantum dots include a first organic ligand and do not include cadmium, lead, or a combination thereof.

The quantum dots may not include a thiol-containing organic compound or a salt thereof bound to a surface of the plurality of quantum dots.

The thiol-containing organic compound or the salt thereof may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin, 2-mercaptopropionic acid, a 2-mercaptopropionate ester, 2-mercaptoethanol, cysteamine, 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol (m(PEG)-SH), a dialkyldithiocarbamic acid, a metal salt thereof, or a combination thereof.

The first organic ligand may include RCOOH, RNH$_2$, R$_2$NH, R$_3$N, R$_3$PO, R$_3$P, ROH, RCOOR, RPO(OH)$_2$, RHPOOH, R$_2$POOH, or a combination thereof, wherein, R is independently a C3 to C40 substituted or unsubstituted aliphatic hydrocarbon group, a C6 to C40 substituted or unsubstituted aromatic hydrocarbon group, or a combination thereof.

The first organic ligand may include a carboxylic acid compound having 10 carbon atoms or more.

A content of the first organic ligand may be greater than or equal to about 1 weight percent (wt %) based on a total weight of the quantum dots.

The plurality of quantum dots may emit blue light.

The metal carboxylate may include zinc, magnesium, aluminum, calcium, sodium, yttrium, indium, titanium, or a combination thereof.

The metal carboxylate may include a compound represented by M(RCOO)$_n$, wherein, R is C1 or more and C30 or less aliphatic hydrocarbon group, M is zinc, magnesium, calcium, or indium, and n is a valence of the metal M.

The metal carboxylate may include acetate, propionate, octanoate, oleate, or a combination thereof.

The metal carboxylate may include zinc acetate, zinc propionate, zinc octanoate, zinc oleate, magnesium acetate, magnesium propionate, magnesium octanoate, magnesium oleate magnesium acetate, calcium propionate, calcium octanoate, calcium oleate, indium octanoate, indium oleate, or a combination thereof.

The emission layer may include the metal carboxylate in an amount of greater than or equal to about 0.1 wt % based on a total weight of the quantum dots.

The emission layer may not include organic thiol-containing compound or a derivative thereof.

The emission layer may not include a polymerization product of polymerizable monomers.

In the emission layer, the plurality of quantum dots may be distributed without aggregation.

The light emitting device may include an electron auxiliary layer disposed between the emission layer and the second electrode.

The electron auxiliary layer may include a nanoparticle including a zinc metal oxide.

The zinc metal oxide may include a zinc oxide, a zinc magnesium oxide, or a combination thereof.

The zinc oxide may be represented by Chemical Formula 1.

$$Zn_{1-x}M_xO \qquad \text{Chemical Formula 1}$$

In Chemical Formula 1,

M is Mg, Ca, Zr, W, Li, Ti, Y, Al, or a combination thereof, and $0 \leq x \leq 0.5$.

The electron auxiliary layer may contact the emission layer and the electrode.

The second electrode may have a first surface facing the emission layer and a second surface opposed to the first surface, the light emitting device includes a polymer layer disposed on a second surface, and the polymer layer may include a polymerization product of a monomer combination including an unsaturated compound having two or more carbon-carbon unsaturated bonds.

The polymer layer may encapsulate the whole light emitting device.

The monomer combination may further include a multiple thiol compound having at least two thiol groups, monothiol compound having one thiol group, or a combination thereof.

The multiple thiol compound may include a dimercaptoacetate compound, a trimercaptoacetate compound, a tetramercaptoacetate compound, a dimercaptopropionate compound, a trimercaptopropionate compound, a tetramercaptopropionate compound, an isocyanate compound including at least two mercaptoalkyl carbonyloxyalkyl groups, an isocyanurate compound including at least two mercaptoalkyl carbonyloxyalkyl groups, or a combination thereof.

The unsaturated compound may include a di(meth)acrylate compound, a tri(meth)acrylate compound, a tetra(meth)acrylate compound, a penta(meth)acrylate compound, a hexa(meth)acrylate compound, or a combination thereof.

The unsaturated compound may not include a carboxylic acid group.

The light emitting device may have maximum external quantum efficiency (Max EQE) of greater than or equal to about 3%.

The light emitting device may have a T50 of greater than or equal to about 20 hours.

A transmission electron microscopy energy-dispersive X-ray spectroscopy (TEM-EDX) analysis for a cross-section of the emission layer may identify presence of a metal atom of the metal carboxylate in the emission layer.

A method of manufacturing the aforementioned light emitting device may include,
preparing an organic solution including the plurality of quantum dots and the metal carboxylate in an organic solvent; and
coating the organic solution on the first electrode or the second electrode.

The organic solution may not include a polymerizable monomer.

The organic solvent may include a first solvent of a substituted or unsubstituted aliphatic hydrocarbon organic solvent, a substituted or unsubstituted aromatic hydrocarbon organic solvent, an acetate solvent, or a combination thereof; and a second solvent that is mixable (preferably miscible) with the first solvent and dissolves the metal carboxylate. The second solvent may include a C1 to C7 alcohol mixable (preferably miscible) with the first solvent.

The emission layer may be disposed on the first electrode, and the method may include forming an electron auxiliary layer on the emission layer; and
forming a polymer layer on the electron auxiliary layer.

A method of manufacturing the aforementioned light emitting device, may include disposing an emission layer comprising a plurality of quantum dots and a metal carboxylate comprising at least one hydrocarbon group having at least one carbon atoms between a first electrode and a second electrode; and wherein the plurality of quantum dots may include a first organic ligand, and may not include cadmium and lead.

An embodiment provides a display device including the aforementioned light emitting device.

According to an embodiment, it is possible to provide an light emitting device having simultaneously improved luminescence properties (e.g., maximum external quantum efficiency and luminance) and device life-span.

DETAILED DESCRIPTION

Figure 1:
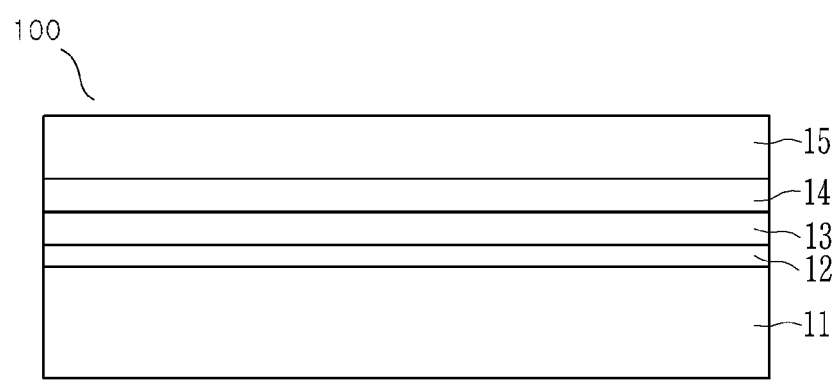
FIG. 1 is a schematic cross-sectional view of a QD LED device according to an embodiment.

Hereinafter, example embodiments of the present disclosure will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, a work function or a highest occupied molecular orbital (HOMO) or a lowest occupied molecular orbital (LUMO) energy level is expressed as an absolute value from a vacuum level. In addition, when the work function or the HOMO or LUMO energy level is referred to be "deep," "high" or "large," the work function or the HOMO energy level has a large absolute value based on "0 electronvolt (eV)" of the vacuum level, while when the work function or the HOMO or LUMO energy level is referred to be "shallow," "low," or "small," the work function or (HOMO or LUMO) energy level has a small absolute value based on "0 eV" of the vacuum level.

As used herein, "Group" may refer to a group of Periodic Table.

As used herein, "Group I" may refer to Group IA and Group IB, and examples may include Li, Na, K, Rb, and Cs, but are not limited thereto.

As used herein, "Group II" may refer to Group IIA and Group IIB, and examples of Group II metal may be Cd, Zn, Hg, and Mg, but are not limited thereto.

As used herein, "Group III" may refer to Group IIIA and Group IIIB, and examples of Group III metal may be Al, In, Ga, and Tl, but are not limited thereto.

As used herein, "Group IV" may refer to Group IVA and Group IVB, and examples of a Group IV metal may be Si, Ge, and Sn, but are not limited thereto. As used herein, the term "metal" may include a semi-metal such as Si.

As used herein, "Group V" may refer to Group VA, and examples thereof may include nitrogen, phosphorus, arsenic, antimony, and bismuth, but are not limited thereto.

As used herein, "Group VI" may refer to Group VIA, and examples thereof may include sulfur, selenium, and tellurium, but are not limited thereto.

As used herein, when a definition is not otherwise provided, "substituted" may refer to replacement of hydrogen of a compound, a group, or a moiety by a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenyl ester group (e.g., an acrylate group, a methacrylate group), a C6 to C30 aryl group, a C7 to C30 alkylaryl group, a C1 to C30 alkoxy group, a C1 to C30 heteroalkyl group, C3 to C40 heteroaryl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a 01 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

Herein, "hydrocarbon group" refers to a group including carbon and hydrogen (e.g., an alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

The wording "aliphatic" may refer to a C1 to C30 linear or branched alkyl (or alkenyl, or alkynyl) group but is not limited thereto.

As used herein, when a definition is not otherwise provided, "alkoxy" refers to an alkyl group that is linked via an oxygen (i.e., alkyl-O—), for example methoxy, ethoxy, and sec-butyloxy groups.

As used herein, when a definition is not otherwise provided, "alkyl" refers to a linear or branched saturated monovalent hydrocarbon group (methyl, ethyl, hexyl, etc.). Unless indicated otherwise, an "alkyl" may have any number of carbon atoms, e.g., from 1 to 60 carbon atoms, or 1 to 32 carbon atoms, or 1 to 24 carbon atoms, or 1 to 12 carbon atoms.

As used herein, when a definition is not otherwise provided, "alkenyl" refers to a linear or branched monovalent hydrocarbon group having one or more carbon-carbon double bond.

As used herein, when a definition is not otherwise provided, "alkynyl" refers to a linear or branched monovalent hydrocarbon group having one or more carbon-carbon triple bond.

As used herein, when a definition is not otherwise provided, an "amine" group has the general formula —NRR, wherein each R is independently hydrogen, a C1-C12 alkyl group, a C7-C20 alkylarylene group, a C7-C20 arylalkylene group, or a C6-C18 aryl group.

As used herein, when a definition is not otherwise provided, "arene" refers to a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, when a definition is not otherwise provided, "aromatic" refers to an organic compound or group comprising at least one unsaturated cyclic group having delocalized pi electrons. The term encompasses both hydrocarbon aromatic compounds and heteroaromatic compounds.

As used herein, when a definition is not otherwise provided, "aryl" refers to a group formed by removal of at least one hydrogen from an aromatic group (e.g., a phenyl or naphthyl group).

As used herein, when a definition is not otherwise provided, "arylalkyl" refers to a substituted or unsubstituted aryl group covalently linked to an alkyl group that is linked to a compound (e.g., a benzyl is a C7 arylalkyl group).

As used herein, when a definition is not otherwise provided, "arylene" refers to a functional group having at least two valences obtained by removal of at least two hydrogens in at least one aromatic ring, and optionally substituted with at least one substituent.

As used herein, when a definition is not otherwise provided, "cycloalkenyl" refers to a monovalent hydrocarbon group having one or more rings and one or more carbon-carbon double bond in the ring, wherein all ring members are carbon (e.g., cyclopentyl and cyclohexyl).

As used herein, when a definition is not otherwise provided, "cycloalkyl" refers to a monovalent hydrocarbon group having one or more saturated rings in which all ring members are carbon (e.g., cyclopentyl and cyclohexyl).

As used herein, when a definition is not otherwise provided, "cycloalkynyl" refers to a stable aliphatic monocyclic or polycyclic group having at least one carbon-carbon triple bond, wherein all ring members are carbon (e.g., cyclohexynyl).

As used herein, when a definition is not otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, when a definition is not otherwise provided, the term "hetero" refers to inclusion of at least one to three heteroatoms, where the heteroatom(s) may be N, O, S, Si, or P, preferably N, O, or S.

As used herein, when a definition is not otherwise provided, "heteroalkyl" refers to an alkyl group that comprises at least one heteroatom covalently bonded to one or more carbon atoms of the alkyl group. As used herein, when a definition is not otherwise provided, "heteroaryl" refers to an aromatic group that comprises at least one heteroatom covalently bonded to one or more carbon atoms of aromatic ring.

(Meth)acryl as used herein is inclusive of acryl and methacryl.

Hereinafter, a light emitting device according to an embodiment is described with reference to drawings.

FIG. 1 is a schematic cross-sectional view of a light emitting device according to an embodiment.

Referring to FIG. 1, a light emitting device 100 according to an embodiment includes a first electrode 11 and a second electrode 15 facing each other, an emission layer 13 disposed between the first electrode 11 and the second electrode 15 and including quantum dots. The emission layer may include a plurality of quantum dots and metal carboxylate having at least one hydrocarbon group of at least one carbon atoms. The plurality of quantum dots includes a first organic ligand (e.g., bound to a surface of the plurality of quantum dots). The plurality of quantum dots does not include cadmium and lead.

The light emitting device 100 may further include a substrate. The substrate may be disposed at the side of the first electrode 11 or the second electrode 15. In an embodiment, the substrate may be disposed at the side of the first electrode. The substrate may be a substrate including an insulation material (e.g., insulating transparent substrate). The substrate may include glass; various polymers such as ester (e.g., polyethylene terephthalate (PET), polyethylene naphthalate (PEN)), polycarbonate, polyacrylate, polyimide, and polyamideimide; polysiloxane (e.g. PDMS); an inorganic material such as $Al_2O_3$, and ZnO; or a combination thereof, but is not limited thereto. The substrate may be made of a silicon wafer. Herein, "transparent" may refer to transmittance for light in a predetermined wavelength (e.g., light emitted from the quantum dot) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material but is not particularly limited. The transparent substrate may have flexibility. The substrate may be omitted.

One of the first electrode 11 and the second electrode 15 may be an anode and the other may be a cathode. For example, the first electrode 11 may be an anode, and the second electrode 15 may be a cathode. For another example, the first electrode 11 may be a cathode, and the second electrode 15 may be an anode.

The first electrode 11 may be made of an electrical conductor, for example, a metal, an electrically conductive metal oxide, or a combination thereof. The first electrode 11 may be for example made of a metal or an alloy thereof such as nickel, platinum, vanadium, chromium, copper, zinc, and gold; a conductive metal oxide such as zinc oxide, indium oxide, tin oxide, indium tin oxide (ITO), indium zinc oxide (IZO), or fluorine doped tin oxide; or a combination of metal and oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode that will be described later.

The second electrode 15 may be made of an electrical conductor, for example a metal, an electrically conductive metal oxide, an electrically conductive polymer, or a combination thereof. The second electrode 15 may be for example a metal or an alloy thereof such as aluminum, magnesium, calcium, sodium, potassium, titanium, indium, yttrium, lithium, gadolinium silver, gold, platinum, tin, lead, cesium, or barium; a multi-layer structured material such as LiF/Al, $Li_2O$/Al, Liq/Al, LiF/Ca, and $BaF_2$/Ca, but is not limited thereto. The electrically conductive metal oxide is the same as described above.

In an embodiment, a work function of the first electrode 11 and a work function of the second electrode 15 may be appropriately selected and not particularly limited. The work function of the first electrode may be lower than the work function of the second electrode. Alternatively, the work function of the first electrode may be higher than the work function of the second electrode.

At least one of the first electrode 11 and the second electrode 15 may be a light-transmitting electrode and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, the non-light-transmitting electrode may be made of for example an opaque conductor such as aluminum (Al), silver (Ag), or gold (Au).

A thickness of the electrodes (the first electrode, the second electrode, or a combination thereof) is not particularly limited and may be appropriately selected considering device efficiency. For example, the thickness of the electrodes may be greater than or equal to about 5 nanometers (nm), for example, greater than or equal to about 50 nm. For example, the thickness of the electrodes may be less than or equal to about 100 micrometers (μm), for example, 10 μm, less than or equal to about 1 μm, less than or equal to about 900 nm, less than or equal to about 500 nm, or less than or equal to about 100 nm.

The emission layer 13 may include a plurality of quantum dots. The emission layer 13 may have a multi-layered structure. The plurality of quantum dots may be nano-sized semiconductor nanocrystal particles and may exhibit a quantum confinement effect.

The plurality of quantum dots (hereinafter, also referred to as quantum dots) may include a Group II-VI compound, a Group III-V compound, a Group IV-VI compound, a Group IV element or compound, a Group compound, a Group compound, a Group I-II-IV-VI compound, or a combination thereof. In an embodiment, the quantum dots do not include cadmium and lead. In an embodiment, the quantum dots may not include heavy metals (e.g., cadmium, lead, mercury, or combination thereof). As used herein, not including the heavy metal means that a metal content is less than or equal to about 100 parts per million (ppm), less than or equal to about 50 ppm, less than or equal to about 30 ppm, or less than or equal to about 20 ppm.

The Group II-VI compound may be a binary element compound of ZnS, ZnSe, ZnTe, ZnO, HgS, HgSe, HgTe, MgSe, MgS, or a combination thereof; a ternary element compound of ZnSeS, ZnSeTe, ZnSTe, HgSeS, HgSeTe, HgSTe, HgZnS, HgZnSe, HgZnTe, MgZnSe, MgZnS, or a combination thereof; or a quaternary element compound of ZnSeSTe, HgZnTeS, HgZnSeS, HgZnSeTe, HgZnSTe, or a combination thereof. The Group II-VI compound may further include a Group III metal. The Group III-V compound may be a binary element compound of GaN, GaP, GaAs, GaSb, AlN, AlP, AlAs, AlSb, InN, InP, InAs, InSb, or a mixture thereof; a ternary element compound of GaNP, GaNAs, GaNSb, GaPAs, GaPSb, AlNP, AlNAs, AlNSb, AlPAs, AlPSb, InNP, InNAs, InNSb, InPAs, InPSb or a combination thereof; or a quaternary element compound of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, or a combination thereof. The Group III-V compound may further include a Group II metal (e.g., InZnP). The Group IV-VI compound may be a binary element compound of SnS, SnSe, SnTe, or a combination thereof; or a ternary element compound of SnSeS, SnSeTe, SnSTe, or a combination thereof. Examples of the Group compound may include CuInSe$_2$, CuInS$_2$, CuInGaSe, CuInGaS, or a combination thereof, but are not limited thereto. Examples of the Group I-II-IV-VI compound may include CuZnSnSe and CuZnSnS, but are not limited thereto. The Group IV element or compound may be a single substance of Si, Ge, or a combination thereof; or a binary element compound of SiC, SiGe, or a combination thereof.

The quantum dots may include a semiconductor nanocrystal including a Group III-V compound including indium and phosphorus. The Group III-V compound may further include zinc. The quantum dots may include a semiconductor nanocrystal including a Group II-VI compound including a chalcogen element (e.g., sulfur, selenium, tellurium, or a combination thereof) and zinc.

In the quantum dots, the aforementioned binary element compound, ternary element compound, the quaternary element compound, or a combination thereof respectively exist in a uniform concentration in the semiconductor nanocrystal particle or partially different concentrations in the same particle. The semiconductor nanocrystals may have a core/shell structure wherein a first semiconductor nanocrystal (core) surrounds another second semiconductor nanocrystal (shell) having the same or different composition. In an embodiment, the quantum dots may include a core including the aforementioned compounds (i.e., the Group II-VI compound, the Group III-V compound, the Group IV-VI compound, the Group IV element or compound, the Group compound, the Group compound, the Group I-II-IV-VI compound, or a combination thereof) and a shell including the aforementioned compounds having different compositions from the core.

In the quantum dot of an embodiment, the core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having two or more layers. The shell may include Zn, Se, and optionally S (e.g., directly) on the core. The shell may include zinc and sulfur in the outermost layer. The quantum dot of an embodiment may have a core including ZnSeTe and a shell including ZnSeS.

The core and the shell may have an interface, and an element of at least one of the core or the shell in the interface may have a concentration gradient wherein the concentration of the element(s) of the shell decreases toward the core. The semiconductor nanocrystals may have a structure including one semiconductor nanocrystal core and a multi-layered shell surrounding the same. Herein, the multi-layered shell has at least two shells wherein each shell may be a single composition, may be an alloy, may have a concentration gradient, or a combination thereof.

In the quantum dots, the shell material and the core material may have different energy bandgap from each other. For example, the energy bandgap of the shell material may be greater than that of the core material. According to an embodiment, the energy bandgap of the shell material may be less than that of the core material. The quantum dots may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc and a shell disposed on the core and including a second semiconductor nanocrystal including zinc and a chalcogen element. In an embodiment, the quantum dot may include a core including a first semiconductor nanocrystal including zinc, selenium, and optionally tellurium and a shell disposed on the core and including a second semiconductor nanocrystal including zinc and a chalcogen element.

A size of the core may be greater than or equal to about 3 nm, greater than or equal to about 4 nm, greater than or equal to about 5 nm, or greater than or equal to about 6 nm. The size of the core may be less than or equal to about 10 nm, less than or equal to about 9 nm, less than or equal to about 8 nm, less than or equal to about 7 nm, less than or equal to about 6 nm, or less than or equal to about 5 nm. The quantum dots may have a particle size of greater than or equal to about 1 nm and less than or equal to about 100 nm. The quantum dots may have a size of about 1 nm to about 20 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, or greater than or equal to about 10 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. The sizes of the quantum dots may be a size of an individual particle or an average size of the particles. The sizes of the quantum dots may be a diameter or a diameter converted from a 2-dimensional (2D) image when they do not have spherical shapes. The sizes of the quantum dots may be determined from electron microscope analysis results (e.g., 2D images) for the quantum dots. The shapes of the quantum dots are not particularly limited. For example, the shapes of the quantum dots may include spheres, polyhedrons, pyramids, multipods, squares, rectangular parallelepipeds, nanotubes, nano rods, nanowires, nanosheets, or combinations thereof, but are not limited thereto. The aforementioned quantum dots may be commercially available or may be appropriately synthesized.

In a light emitting device according to an embodiment, the quantum dots may include a first organic ligand. The first organic ligand may have a hydrophobic moiety. The first organic ligand may be bound to the surface of the quantum dots. The first organic ligand may be RCOOH, $RNH_2$, $R_2NH$, $R_3N$, $R_3PO$, $R_3P$, ROH, RCOOR, $RPO(OH)_2$, RHPOOH, $R_2POOH$, or a combination thereof, wherein each R is independently a C3 or more, for example, C5 or more, and C40 or more, for example, C25 or less substituted or unsubstituted aliphatic hydrocarbon group, a C6 or more and C40 or less, for example, C25 or less substituted or unsubstituted aromatic hydrocarbon group, or a combination thereof. Herein, the aliphatic hydrocarbon group may include an alkyl group, an alkenyl group, an alkynyl group, or a combination thereof and the aromatic hydrocarbon group may include an aryl group.

The first organic ligand may include a carboxylic acid compound having 10 carbon atoms or more, for example up to 60 (or 50, 40, 35, 30, or 25) carbon atoms. The first organic ligand may include a fatty acid compound. The first organic ligand may include a phosphoric acid or a phosphonic acid compound, for example a phosphoric acid or phosphonic acid compound having 10 (or 15) carbon atoms or more, for example up to 60 (or 50, 40, 35, 30, or 25) carbon atoms. The first organic ligand may include oleic acid, myristic acid, stearic acid, a C10 (or C15) to C60 (or C50, C40, C35, C30, or C25) phosphonic acid, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; an amine compound such as methane amine, ethane amine, propane amine, butane amine, pentyl amine, hexyl amine, octyl amine, nonylamine, decylamine, dodecyl amine, hexadecyl amine, octadecyl amine, dimethyl amine, diethyl amine, dipropyl amine, tributylamine, or trioctylamine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octylphosphine, dioctyl phosphine, tributylphosphine, diphenyl phosphine, triphenyl phosphine, or trioctylphosphine; a phosphine oxide compound such as methyl phosphine oxide, ethyl phosphine oxide, propyl phosphine oxide, butyl phosphine oxide pentyl phosphine oxide, tributylphosphine oxide, octylphosphine oxide, dioctyl phosphine oxide, diphenyl phosphine oxide, triphenyl phosphine oxide, or trioctylphosphine oxide; a C5 to C20 alkyl phosphonic; a C5 to C20 alkyl phosphinic acid such as hexylphosphinic acid, octylphosphinic acid, dodecanephosphinic acid, tetradecanephosphinic acid, hexadecanephosphinic acid, octadecanephosphinic acid; and the like, but are not limited thereto. The quantum dots may include a hydrophobic organic ligand alone or in a mixture of at least one type. The hydrophobic organic ligand may not include a photopolymerizable moiety (e.g., acrylate group, methacrylate group, etc.).

A content of the first organic ligand may be greater than or equal to about 1 wt %, for example, greater than or equal to about 2 wt %, or greater than or equal to about 3 wt %, greater than or equal to about 4 wt %, or greater than or equal to about 5 wt % based on a total weight of the quantum dots. The content of the first organic ligand may be less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, or less than or equal to about 10 wt % based on a total weight of the quantum dots.

The plurality of quantum dots may emit light in a wavelength of a visible light region. In an embodiment, the plurality of quantum dots may emit blue light in an electroluminescent device. The plurality of quantum dots may emit red light in an electroluminescent device. The plurality of quantum dots may emit green light in an electroluminescent device. The blue light may have a central wavelength in a greater than or equal to about 450 nm and less than or equal to about 480 nm or less than or equal to about 470 nm. The green light may have a central wavelength in greater than or equal to about 500 nm and less than or equal to about 550 nm or to about 510 nm to about 530 nm. The red light may have a central wavelength in greater than or equal to about 600 nm and less than or equal to about 650 nm, (e.g., less than or equal to about 640 nm, less than or equal to about 630 nm, less than or equal to about 620 nm, or less than or equal to about 610 nm).

The plurality of quantum dots may have luminous efficiency of greater than or equal to about 50%, for example, greater than or equal to about 60%, greater than or equal to about 65%, greater than or equal to about 70%, greater than or equal to about 80%, or greater than or equal to about 85%. The plurality of quantum dots may have a full width at half maximum (FWHM) of less than or equal to about 55 nm, for example, less than or equal to about 50 nm, less than or equal to about 40 nm, less than or equal to about 35 nm, or less than or equal to about 30 nm.

Quantum dots (e.g., colloidal quantum dots) may exhibit a quantum confinement effect and, may be electrically or optically excited and thus emit light. Compositions and sizes of the quantum dots may be adjusted to control an energy bandgap and an emission wavelength thereof. The quantum dots may be included as a light emitting material in a display, which may realize improved color purity and increased color reproducibility. An electroluminescent device including the quantum dots may have an emission layer including the quantum dots between electrodes (e.g., a transparent electrode and a metal electrode), and a charge auxiliary layer, for example, an organic hole injection layer, a hole transport layer, an electron transport layer, and the like, may be disposed between the emission layer and the electrodes. In the electroluminescent device, the quantum dot-containing emission layer may be formed in a solution process by dispersing the quantum dots in an organic solvent, and accordingly, a large-area display may be manufactured at reduced cost.

However, currently, the quantum dots applied to a device to show a desirable level of properties (e.g., luminescence properties and a life-span) are cadmium-containing (e.g., include cadmium in a core and/or shell). Without wishing to be bound by any particular theory, in case of cadmium-free quantum dots, application to the electroluminescent device is difficult as they may hardly accomplish (e.g., in a consistent manner) a desirable charge balance in the emission layer even with the provision of the charge auxiliary layer (e.g., electron/hole transport layers) that may otherwise provide an optimal performance (e.g., injection/transport of a predetermined amount of charges). Such a charge imbalance problem in case of the cadmium free quantum dots may lead to deteriorated luminescence properties and/or a shortened life-span in comparison with the cadmium-based quantum dots. In order to realize a quantum dot-containing display, a material capable of emitting blue light with a high efficiency and a desired stability is desirable, but currently, the cadmium free quantum dots emitting blue light exhibit a significantly shortened life-span in comparison with the cadmium-containing ones. Without wishing to be bound by any particular theory, as an exciton energy necessary for the quantum dots to emit blue light is high, the holes injected during operation of a device tend to detach the ligand bound to the quantum dots more easily, which may in turn significantly shorten a life-span of the device.

For the electroluminescent device (e.g., having an inorganic oxide nanoparticle-containing electron auxiliary layer), a balance between hole transport properties and/or electron transport properties of an emission layer may have a greater impact on the device, but as for the cadmium free quantum dots, it is not easy to achieve the balance therebetween, and thus, accomplishing desirable luminescence properties and life-span during operation of a device is difficult.

Without wishing to be bound by any particular theory, the colloidal cadmium free quantum dot may have an organic ligand coverage on a surface thereof that is lower than the cadmium containing quantum dot (e.g., during the operation of the device), and such a lower coverage may be translated into an increase in the numbers of the defects on its surface, leading to a deteriorated efficiency and a shorter life-span of the device as a whole. It may be difficult for the injected carriers to form exciton for example at a defect site on a surface of a quantum dot, and/or the defects may act as a trap of the charge carrier, causing a leakage of current. The increase in the number of surface defects may reduce the possibility for the radiative decay in the quantum dots, resulting in a reduced efficiency of the device.

A light emitting device of an embodiment may have an emission layer (hereinafter, also referred to as a mixed emission layer) including a metal carboxylate and the aforementioned quantum dots having an organic ligand on the surface, as well. In the device of an embodiment, the emission layer may exhibit improved electroluminescence properties and extended life-span characteristics by the inclusion of the metal carboxylate along with the quantum dots having a first organic ligand, as explained in detail below. In an embodiment, the emission layer may include a combination (e.g., mixture) of the aforementioned quantum dots and metal carboxylate. In an embodiment, the metal carboxylate may be bound to the quantum dots. In an embodiment, the metal carboxylate bound to the quantum dots may not be separated from the quantum dots after they are dispersed in an organic solvent capable of dispersing the quantum dots (e.g., hexane, toluene, etc.) and then adding a nonsolvent thereto to recover them.

The quantum dots to which the metal carboxylate is bound along with the first organic ligand may exhibit improved dispersibility towards an organic solvent. Thus, in an embodiment, in an emission layer of a device the plurality of quantum dots may be distributed without aggregation.

The metal carboxylate may include the metal in (e.g., constituting) the outermost layer of the quantum dots. In an embodiment, the outermost layer of the quantum dots may include zinc, and thus, the metal carboxylate may include zinc.

The present inventors have, surprisingly, found that this mixed emission layer may significantly improve luminescence properties of the device. The present inventors have, surprisingly, found that this mixed emission layer (if necessary, along with a metal oxide-containing charge auxiliary layer (an electron transport layer), which will be described below and/or a polymer layer disposed on an electrode) may significantly improve life-span characteristics of the device. Without wishing to be bound by any particular theory, the metal carboxylate may enhance the binding between the surface of the quantum dots and the first organic ligand in the emission layer and/or additionally couple the first organic ligand on the surface. Without wishing to be bound by any particular theory, the metal carboxylate may form a coordination bond with elements exposed on the surface of the quantum dots. Such a bonding may make it possible for the metal carboxylate along with the first organic ligand or through an interaction with the same to provide additional passivation to the surface of the quantum dots and/or to replace at least a portion of the first ligand. The metal carboxylate may increase the surface coverage by the ligand in the quantum dot in the emission layer. Without wishing to be bound by any particular theory, the cadmium free quantum dots may exhibit insufficient binding to the ligand, but in the light emitting device according to an embodiment, the metal carboxylate mixed in the emission layer may enhance the binding between the surface of the cadmium free quantum dots with the ligand or may be bound on the surface of the quantum dot where the first organic ligand detached and does not cover the same (when the quantum dots are in a colloid solution state or during operation of the device), and accordingly, stability of the quantum dots and quantum efficiency during operation of the device may be greatly improved.

In an embodiment, the quantum dots may include zinc and sulfur on the surface, the first organic ligand may include a carboxylic acid compound, and the metal carboxylate may include zinc carboxylate. Without wishing to be bound by any particular theory, in the emission layer, the carboxylic acid compound may coordinate to the zinc on the surface of the quantum dots, and the metal carboxylate may coordinate to the sulfur on the surface of the quantum dots and/or the Zn, with no coordination of the first organic ligand on the surface of the quantum dots may obtain the coordination of the metal carboxylate. The metal carboxylate may replace the first organic ligand on the surface of the quantum dots in the emission layer.

The metal carboxylate may include zinc, magnesium, aluminum, calcium, sodium, yttrium, titanium, or a combination thereof. In an embodiment, the metal carboxylate may include zinc. The metal carboxylate may include a compound represented by $M(RCOO)_n$, wherein, R is an aliphatic hydrocarbon group, M is zinc, magnesium, calcium, indium, or a combination thereof, and n is a valence of the metal M. The number of carbon of the aliphatic hydrocarbon of R may be 1 or more, for example, 2 or more, 3 or more, 4 or more, 5 or more, 6 or more, 7 or more, 8 or more, 9 or more, 10 or more, 11 or more, 12 or more, 13 or more, or 14 or more and 30 or less, 29 or less, 28 or less, 27 or less, 26 or less, 25 or less, 24 or less, 23 or less, 26 or less, 25 or less, 24 or less, 23 or less, 22 or less, 21 or less, 20 or less, 15 or less, 10 or less, 9 or less, 8 or less, 7 or less, 6 or less, 5 or less, 4 or less, 3 or less, or 2 or less.

The metal carboxylate may include acetate, propionate, octanoate, oleate, lactate, or a combination thereof.

The metal carboxylate may include zinc acetate, zinc propionate, zinc octanoate, zinc oleate, zinc lactate, or a combination thereof.

The metal carboxylate may include calcium acetate, calcium propionate, calcium octanoate, calcium oleate, calcium lactate, or a combination thereof.

The metal carboxylate may include magnesium acetate, magnesium propionate, magnesium octanoate, magnesium oleate, magnesium lactate, or a combination thereof.

The metal carboxylate may include indium acetate, indium propionate, indium octanoate, indium oleate, indium lactate, or a combination thereof.

The metal carboxylate may be a combination of the aforementioned compounds.

The emission layer may include the metal carboxylate in an amount of greater than or equal to about 0.1 wt % based on a total weight of the quantum dots. In the emission layer, a content of the metal carboxylate based on 1 mole (mol) of the first organic ligand of the first quantum dot may be greater than or equal to about 0.001 mol, greater than or equal to about 0.01 mol, greater than or equal to about 0.1 mol, greater than or equal to about 0.15 mol, or greater than or equal to about 0.2 mol. In the emission layer, a content of the metal carboxylate based on 1 mol of the first organic ligand may be less than or equal to about 0.5 mol, less than or equal to about 0.4 mol, or less than or equal to about 0.3 mol.

Compared with quantum dots having the first organic ligand alone, quantum dots bound with metal carboxylate along with the first organic ligand exhibit greatly increased CH peak intensity at 2800 to 3000 reciprocal centimeters ($cm^{-1}$) and COO— peak intensity at 1400 to 1600 $cm^{-1}$ in an infrared ray spectrum.

In a differential thermal analysis of the emission layer, a ratio of a peak derived from the metal carboxylate relative to a peak derived from the first organic ligand (first organic ligand area:metal carboxylate area) may be greater than or equal to about 1:1.2, greater than or equal to about 1:1.5, greater than or equal to about 1:1.7, greater than or equal to about 1:2, greater than or equal to about 1:2.5, greater than or equal to about 1:3, greater than or equal to about 1:3.5, greater than or equal to about 1:4, or greater than or equal to about 1:4.5 and less than or equal to about 1:10, less than or equal to about 1:9, less than or equal to about 1:8, less than or equal to about 1:6, less than or equal to about 1:5, or less than or equal to about 1:4.5.

In an embodiment, the quantum dots or the emission layer in a light emitting device may not include a thiol-containing organic compound or a salt thereof bound to the surface. The thiol-containing organic compound or the salt thereof may include butanethiol, pentanethiol, hexanethiol, heptanethiol, octanethiol, nonanethiol, decanethiol, undecanethiol, dodecanethiol, octadecanethiol, 2-(2-methoxyethoxy)ethanethiol, 3-methoxybutyl 3-mercaptopropionate, 3-methoxybutylmercaptoacetate, thioglycolic acid, 3-mercaptopropionic acid, thiopronin (2-(2-sulfanylpropanoylamino)acetic acid), 2-mercaptopropionic acid, a 2-mercaptopropionate ester, 2-mercaptoethanol, cysteamine (2-aminoethanethiol), 1-thioglycerol, mercaptosuccinic acid, L-cysteine, dihydrolipoic acid, 2-(dimethylamino)ethanethiol, 5-mercaptomethyltetrazole, 2,3-dimercapto-1-propanol, glutathione, methoxypoly(ethylene glycol) thiol (m(PEG)-SH), a dialkyldithiocarbamic acid, a metal salt thereof, or a combination thereof. When the emission layer does not include the thiol-containing organic compound or the salt thereof (e.g., bound to the surface), life-span characteristics may be further improved.

The emission layer may not include a polymerization product of a polymerizable monomer. The polymerizable monomer may be a radical polymerizable monomer. The polymerizable monomer may be a mono-functional or multi-functional (meth)acrylate monomer. The mono-functional or multi-functional (meth)acrylate monomer may be a monomer having one or more polymerizable unsaturated bond of (meth)acrylic acid in the molecule. The mono-functional or multi-functional (meth)acrylate monomer may have a carbon number of 4 or more and 30 or less.

The emission layer 13 may have a first surface facing the second electrode and a second surface opposed to the first surface. A content of the metal carboxylate may be the same on the first surface and the second surface of the emission layer. A content of the metal carboxylate may be different on the first surface and the second surface of the emission layer.

A thickness of the emission layer 13 may be greater than or equal to about 5 nm, for example, greater than or equal to about 10 nm, greater than or equal to about 20 nm, or greater than or equal to about 30 nm and less than or equal to about 200 nm, for example, 150 nm, less than or equal to about 100 nm, less than or equal to about 90 nm, less than or equal to about 80 nm, less than or equal to about 70 nm, less than or equal to about 60 nm, or less than or equal to about 50 nm. The thickness of the emission layer 13 may be for example about 10 nm to about 150 nm, about 10 nm to about 100 nm, or about 10 nm to about 50 nm.

The emission layer 13 may have an appropriately controlled highest occupied molecular orbital (HOMO) energy level. In an embodiment, a HOMO level of the emission layer 13 may be greater than or equal to about −6.5 electronvolt (eV) and less than or equal to about −5.5 eV, but is not limited thereto. A lowest occupied molecular orbital (LUMO) level of the emission layer 13 may be greater than or equal to about −3.5 eV and less than or equal to about −2.7 eV, but is not limited thereto.

A light emitting device of an embodiment may include a charge auxiliary layer. The charge auxiliary layer may include an electron auxiliary layer, a hole auxiliary layer, or a combination thereof.

The hole auxiliary layer 12 may be disposed between the first electrode 11 (e.g., anode) and the emission layer 13. The hole auxiliary layer 12 may have one layer or two or more layers and may include, for example a hole injection layer, a hole transport layer, an electron blocking layer, or a combination thereof. The hole auxiliary layer may be in contact with the emission layer and the electrode. In an embodiment, the hole auxiliary layer 12 may include a hole injection layer near (adjacent) to the first electrode 11 (e.g., contacting the first electrode) and a hole transport layer near (adjacent) to the emission layer 13 (e.g., contacting the emission layer).

The HOMO energy level of the hole auxiliary layer 12 may be matched with a HOMO energy level of the emission layer 13, whereby mobility of holes from the hole auxiliary layer 12 into the emission layer 13 may be enforced.

The HOMO energy level of the hole auxiliary layer (e.g., hole transport layer, hole injection layer, or a combination thereof) 12 adjacent to the emission layer may be the same as the HOMO energy level of the emission layer 13 or may be less than the HOMO energy level of the emission layer 13 within a range of less than or equal to about 1.0 eV. For example, a difference between the HOMO energy levels of the auxiliary layer 12 and the emission layer 13 may be from about 0 eV to about 1.0 eV, but is not limited thereto.

A HOMO energy level of the hole auxiliary layer 12 (e.g., hole transport layer, hole injection layer, or a combination thereof) may be greater than or equal to about −6.0 eV and less than or equal to about −5.0 eV, but is not limited thereto.

A material included in the hole auxiliary layer 12 (e.g., hole transport layer, hole injection layer, or a combination thereof) is not particularly limited and may include, for example, poly(9,9-dioctyl-fluorene-co-N-(4-butylphenyl)-diphenylamine) (TFB), a polyarylamine, poly(N-vinylcarbazole), poly(3,4-ethylenedioxythiophene) (PEDOT), poly (3,4-ethylenedioxythiophene) polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (alpha-NPD), m-MTDATA (4,4', 4''-tris[phenyl(m-tolyl)amino]triphenylamine), 4,4',4''-tris (N-carbazolyl)-triphenylamine (TCTA), 1,1-bis[(di-4-tolylamino)phenylcyclohexane (TAPC), dipyrazino[2,3-f:2', 3'-h]quinoxaline-2,3,6,7,10,11-hexacarbonitrile (HAT-CN), p-type metal oxide (e.g., NiO, $WO_3$, $MoO_3$, etc.), a carbon-containing material such as graphene oxide, or a combination thereof, but is not limited thereto.

In the hole auxiliary layer(s), a thickness of each layer may be selected appropriately. For example, a thickness of each layer may be greater than or equal to about 10 nm, for example, greater than or equal to about 15 nm, greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The electron auxiliary layer 14 is disposed between the emission layer 13 and the second electrode 15 (e.g., cathode). The electron auxiliary layer 14 may include, for example, an electron injection layer, an electron transport layer, a hole blocking layer, or a combination thereof, but is not limited thereto. In an embodiment, the electron auxiliary layer 14 may include an electron transport layer. The electron auxiliary layer (e.g., the electron transport layer) may contact the emission layer and the electrode.

The electron transport layer and/or the electron injection layer may include, for example, 1,4,5,8-naphthalene-tetracarboxylic dianhydride (NTCDA), bathocuproine (BCP), tris [3-(3-pyridyl)-mesityl]borane (3TPYMB), LiF, $Alq_3$ (wherein, q 8-hydroxyquinoline), $Gaq_3$, $Inq_3$, $Znq_2$, $Zn(BTZ)_2$, $BeBq_2$, ET204 (8-(4-(4,6-di(naphthalen-2-yl)-1, 3,5-triazin-2-yl)phenyl)quinolone), 8-hydroxyquinolinato lithium (Liq), an n-type metal oxide (e.g., ZnO, $HfO_2$, etc.), or a combination thereof, but is not limited thereto. The hole blocking layer (HBL) may include, for example 1,4,5,8-naphthalene-tetracarboxylic dianhydride (NTCDA), bathocuproine (BCP), tris[3-(3-pyridyl)-mesityl]borane (3TP-YMB), LiF, $Alq_3$ (wherein, q=8-hydroxyquinoline), Gaq3, Inq3, Znq2, $Zn(BTZ)_2$, $BeBq_2$, or a combination thereof, but is not limited thereto.

In an embodiment, the electron auxiliary layer 14 (e.g., electron transport layer) may include a plurality of nanoparticles. The nanoparticles may include a metal oxide including zinc, i.e., a zinc metal oxide. As used herein, a "zinc metal oxide" may contain zinc as the only metal, or zinc and another metal. For example, the zinc metal oxide may be of Chemical Formula 1:

$$Zn_{1-x}M_xO \qquad \text{Chemical Formula 1}$$

wherein, in Chemical Formula 1, M is Mg, Ca, Zr, W, Li, Ti, Y, Al, or a combination thereof, and 0≤x≤0.5. In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15.

The metal oxide including zinc may include a zinc oxide, a zinc magnesium oxide, or a combination thereof. The absolute value of LUMO of the quantum dots included in the emission layer may be less than the absolute value of LUMO of the zinc metal oxide. According to another embodiment, the LUMO absolute value of the quantum dots may be greater than the LUMO absolute value of the zinc metal oxide electron-transporting layer (ETL). The absolute value of LUMO of blue quantum dots (QD) may be less than the absolute value of LUMO of the metal oxide ETL. The electron injection in the electroluminescent device including blue QD may be different from the light emitting device including red or green quantum dots.

An average size of the zinc metal oxide nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The zinc metal oxide nanoparticles may not have a rod shape. The nanoparticles may not have a nanowire shape.

In an embodiment, each thickness of the electron auxiliary layer 14 (e.g., electron injection layer, electron transport layer, or hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

Figure 2:
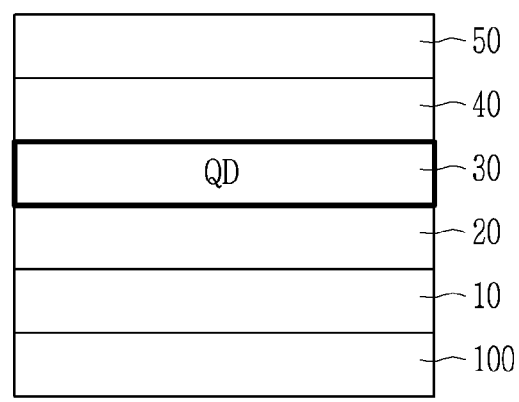
FIG. 2 is a schematic cross-sectional view of a QD LED device according to an embodiment.

A device according to an embodiment may have a normal structure. In an embodiment, in the device as shown in FIG. 2, an anode 10 disposed on a transparent substrate 100 may include a metal oxide-containing transparent electrode (e.g., ITO electrode) and a cathode 50 facing the anode 10 may include a conductive metal (Mg, Al, Ag, or a combination thereof, etc.) (e.g., having a relatively low work function). A hole auxiliary layer 20 (e.g., a hole injection layer of PEDOT:PSS, p-type metal oxide, and the like, hole transport layer of TFB, PVK, or a combination thereof) may be disposed between the transparent electrode 10 and the quantum dot emission layer 30. The hole injection layer may be near to the transparent electrode and the hole transport layer may be near to the emission layer. An electron auxiliary layer 40 such as an electron injection layer or a transport layer may be disposed between the quantum dot emission layer 30 and the cathode 50.

Figure 3:
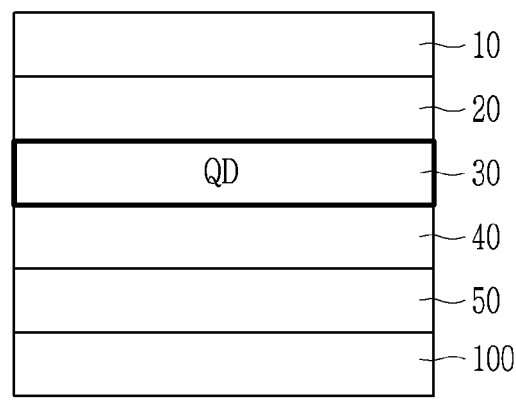
FIG. 3 is a schematic cross-sectional view of a QD LED device according to an embodiment.

According to an embodiment, a device shown in FIG. 3 may have an inverted structure. A cathode 50 disposed on the transparent substrate 100 may include a metal oxide-containing transparent electrode (e.g., ITO) and an anode 10 facing the cathode may include a metal (Au, Ag, Al, Mg, or a combination thereof, etc.) (e.g., having a relatively high work function). For example, (optionally doped) n-type metal oxide (crystalline Zn metal oxide) may be disposed between the transparent electrode 50 and the emission layer 30 as an electron auxiliary layer (e.g., electron transport layer) 40. $MoO_3$ or other p-type metal oxides may be disposed between the metal anode 10 and the quantum dot emission layer 30 as a hole auxiliary layer (e.g., a hole transport layer including TFB, a hole injection layer including PVK, $MoO_3$, or other p-type metal oxides) 20.

In an embodiment, the second electrode may have a first surface facing the emission layer and a second surface opposed to the first surface and the light emitting device may include a polymer layer disposed on a second surface. The polymer layer may encapsulate the whole device.

Figure 4:
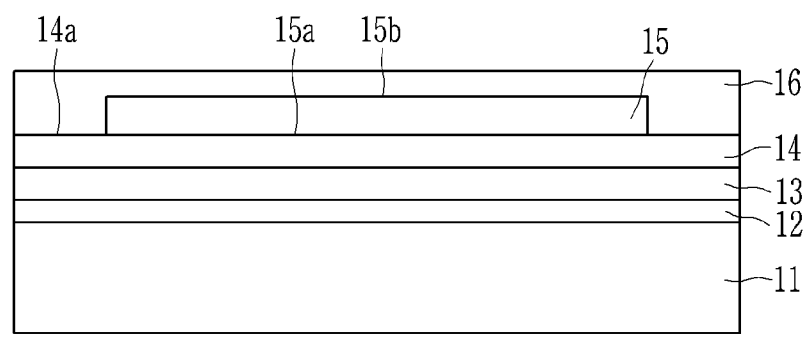
FIG. 4 is a schematic cross-sectional view of a QD LED device according to an embodiment.

FIG. 4 is a non-limiting schematic cross-sectional view of the device according to an embodiment. Referring to FIG. 4, in a device according to an embodiment, a second electrode (e.g., cathode) is disposed on one portion of the surface 14a of the electron auxiliary layer. The second electrode may cover a portion or whole of the surface of the electron auxiliary layer The second electrode may have a first surface 15a facing the surface of the electron auxiliary layer and a second surface 15b opposed to the first surface 15a.

According to an embodiment, the light emitting device may include a polymer layer disposed (e.g., directly) on at least a portion (or the entire) of the second surface and at least a portion of the surface of the electron auxiliary layer (e.g., the entire portion except the portion on which the second electrode is disposed). The polymer layer may be disposed directly on (e.g., contacting) at least a portion of the second surface and at least a portion of the surface of the electron auxiliary layer. The polymer layer may cover the entire portion of the second surface and the entire portion except the portion on which the second electrode is disposed in the electron auxiliary layer.

The polymer layer may include a polymerization product of a monomer combination including unsaturated compounds having at least two carbon-carbon unsaturated bonds. The monomer combination may further include a multiple thiol compound having at least two thiol groups, a monothiol compound having one thiol group, or a combination thereof. The polymer layer may include a polymerization product of a monomer combination including a thiol compound having at least one (e.g., at least two) thiol group (e.g., multiple thiol compound, hereinafter, also referred to as multi-thiol compound) and an unsaturated compound having at least two carbon-carbon unsaturated bonds.

The multi-thiol compound may be represented by Chemical Formula A:

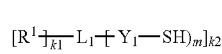

Chemial Formula A wherein, in Chemical Formula 1, $R^1$ is hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are independently hydrogen or a C1 to C30 linear or branched alkyl group, and are not simultaneously hydrogen), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)NRR' or —C(=O)ONRR' (wherein R and R' are independently hydrogen or a C1 to C20 linear or branched alkyl group), or a combination thereof, $L_1$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkylene group or a substituted or unsubstituted C3 to C30 alkenylene group where at least one methylene (—$CH_2$—) is replaced by a sulfonyl group (—$SO_2$—), a carbonyl group ((—C(=O)), an ether group (—O—), a sulfide (—S—), a sulfoxide group (—SO—), an ester group (—C(=O)O—), an amide group (—C(=O)NR—, wherein R is hydrogen or a C1 to C10 alkyl group), or a combination thereof, $Y_1$ is a single bond, a substituted or unsubstituted C1 to C30 alkylene group, a substituted or unsubstituted C2 to C30 alkenylene group, or a substituted C2 to C30 alkylene group or a substituted or unsubstituted C3 to C30 alkenylene group where at least one methylene (—$CH_2$—) is replaced by a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, m is an integer of 1 or greater, for example 1 to 10, k1 is 0 or an integer of 1 or greater, for example 1 to 10, k2 is an integer of 1 or greater, for example 1 to 10, and the sum of m and k2 is an integer of 3 or greater, for example 3 to 20, provided that when $Y_1$ is not a single bond, m does not exceed the valence of $Y_1$, and the sum of k1 and k2 does not exceed the valence of $L_1$.

The multithiol compound may be represented by Chemical Formula A-1:

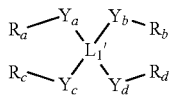

Chemical Formula A-1 wherein, in Chemical Formula 1-1, $L_1'$ is the same as $L_1$ of Chemical Formula 1, and may be for example, carbon, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—$S(=O)_2$—), a carbonyl group (—$C(=O)$—), an ether group (—O—), a sulfide group (—S—), a sulfoxide group (—$S(=O)$—), an ester group (—$C(=O)O$—), an amide group (—$C(=O)NR$—) (wherein R is hydrogen or a C1 to C10 linear or branched alkyl group), an imine group (—NR—) (wherein R is hydrogen or a C1 to C10 linear or branched alkyl group), or a combination thereof, and $R_a$ to $R_d$ are independently $R^1$ of Chemical Formula 1 or SH, provided that at least two of $R_a$ to $R_d$ are SH.

The center moiety, e.g., $L_1$ or $L_1'$ of Chemical Formula A or Chemical Formula A-1, may include a triazine moiety, a triazinetrione moiety, a quinoline moiety, a quinolone moiety, a naphthalene moiety, or a combination thereof.

The multi-thiol compound may include a dimercaptoacetate compound, a trimercaptoacetate compound, a tetramercaptoacetate compound, a dimercaptopropionate compound, a trimercaptopropionate compound, a tetramercaptopropionate compound, an isocyanate compound including at least two mercaptoalkyl carbonyloxyalkyl groups, an isocyanurate compound including at least two mercaptoalkyl carbonyloxyalkyl groups, or a combination thereof.

The unsaturated compound may be represented by Chemical Formula 2:

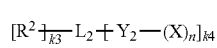

Chemial Formula 2 wherein, X is a C2-C30 aliphatic organic group having a carbon-carbon double bond or a carbon-carbon triple bond, a C6-C30 aromatic organic group having a carbon-carbon double bond or a carbon-carbon triple bond, or a C3-C30 alicyclic organic group having a carbon-carbon double bond or a carbon-carbon triple bond, $R^2$ is hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group; a hydroxy group, —$NH_2$, a substituted or unsubstituted C1 to C30 amine group (—NRR', wherein R and R' are independently hydrogen or a C1 to C30 linear or branched alkyl group), an isocyanate group, a halogen, —ROR' (wherein R is a substituted or unsubstituted C1 to C20 alkylene group R' is hydrogen or a C1 to C20 linear or branched alkyl group), an acyl halide group (—RC(=O)X, wherein R is a substituted or unsubstituted alkylene group and X is a halogen), —C(=O)OR' (wherein R' is hydrogen or a C1 to C20 linear or branched alkyl group), —CN, or —C(=O)ONRR' (wherein R and R' are independently hydrogen or a C1 to C20 linear or branched alkyl group), $L_2$ is a carbon atom, a substituted or unsubstituted C1 to C30 alkylene group, a substituted or unsubstituted C2 to C30 alkenylene group, a substituted or unsubstituted C3 to C30 cycloalkylene group, a substituted or unsubstituted C6 to C30 arylene group, or a substituted or unsubstituted C3 to C30 heteroarylene group (e.g., quinoline, quinolone, triazine, triazinetrione moiety, etc.), a C3 to C30 heterocycloalkylene group, or a substituted or unsubstituted C2 to C30 alkylene group or a substituted or unsubstituted C3 to C30 alkenylene group where at least one methylene (—$CH_2$—) is replaced by a sulfonyl group (—$SO_2$—), a carbonyl group ((—C(=O)—), an ether group (—O—), a sulfide group (—S—), a sulfoxide group (—SO—), an ester group (—C(=O)O—), an amide group (—C(=O)NR—) (wherein R is hydrogen or a C1 to C10 alkyl group), or a combination thereof, $Y_2$ is a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—$S(=O)_2$—), a carbonyl group (—$C(=O)$—), an ether group (—O—), a sulfide group (—S—), a sulfoxide group (—$S(=O)$—), an ester group (—$C(=O)O$—), an amide group (—$C(=O)NR$—) (wherein R is hydrogen or a C1 to C10 linear or branched alkyl group), an imine group (—NR—) (wherein R is hydrogen or a C1 to C10 linear or branched alkyl group), or a combination thereof, n is an integer of 1 or greater, for example, 1 to 10, k3 is 0 or an integer of 1 or greater, for example, 1 to 10, k4 is an integer of 1 or greater, for example, 1 to 10, the sum of n and k4 is an integer of 3 or more, for example 3 to 20, n does not exceed the valence of $Y_2$, and the sum of k3 and k4 does not exceed the valence of $L_2$.

In Chemical Formula 2, X may be an acrylate group, a methacrylate group, a C2 to C30 alkenyl group, a C2 to C30 alkynyl group, a substituted or unsubstituted C3 to C30 alicyclic organic group having a carbon-carbon double bond or a carbon-carbon triple bond in the ring, a substituted or unsubstituted C3 to C30 heterocycloalkyl group having a carbon-carbon double bond or a carbon-carbon triple bond in the ring, a C3 to C30 alicyclic organic group substituted with a C2 to C30 alkenyl group or a C2 to C30 alkynyl group, or a C3 to C30 heterocycloalkyl group substituted with a C2 to C30 alkenyl group or a C2 to C30 alkynyl group.

The unsaturated compound may include a di(meth)acrylate compound, a tri(meth)acrylate compound, a tetra(meth)acrylate compound, a penta(meth)acrylate compound, a hexa(meth)acrylate compound, or a combination thereof. The unsaturated compound may not include a carboxylic acid group.

The unsaturated compound may include a center moiety and at least two X'—R—* bound to the center moiety, wherein, X' is a moiety including a carbon-carbon unsaturated bond, for example, a double bond, R is a substituted or unsubstituted C1 to C30 aliphatic hydrocarbon group or a substituted or unsubstituted C1 to C30 aliphatic hydrocarbon group where at least one methylene is replaced by sulfonyl, carbonyl, ether, sulfide, sulfoxide, ester, amide, or a combination thereof, and * is a linking portion with the center moiety. The R may be a single bond, a substituted or unsubstituted C1 to C30 alkylene group, a substituted or unsubstituted C2 to C30 alkenylene group, or a substituted or unsubstituted C2 to C30 alkylene group or a substituted or unsubstituted C3 to C30 alkenylene group where at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 linear or branched alkyl group), or a combination thereof. The center moiety may include a carbon atom, a substituted or unsubstituted C1 to C30 aliphatic hydrocarbon group, a substituted or unsubstituted C3 to C30 alicyclic hydrocarbon group, a substituted or unsubstituted C6 to C30 aromatic hydrocarbon group, a substituted or unsubstituted C3 to C30 heteroarylene group, a substituted or unsubstituted C3 to C30 heterocyclic group, or a combination thereof. The center moiety may include a triazine moiety, a triazinetrione moiety, quinoline moiety, a quinolone moiety, a naphthalene moiety, or a combination thereof.

The unsaturated compound may include any of compound (s) represented by Chemical Formula 2-1, Chemical Formula 2-2 or Chemical Formula 2-3:

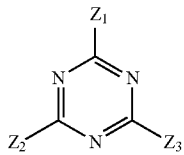

Chemical Formula 2-1

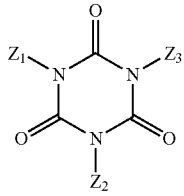

Chemical Formula 2-2

In the Chemical Formulae 2-1 and 2-2, $Z_1$ to $Z_3$ are each independently the moiety represented by X'—R—*.

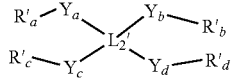

Chemical Formula 2-3 wherein, in Chemical Formula 2-3, $L_2'$ is carbon, a substituted or unsubstituted C1 to C30 alkylene group, a substituted or unsubstituted C2 to C30 alkenylene group, a substituted or unsubstituted C2 to C30 alkylene group wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof; a substituted or unsubstituted C3 to C30 alkenylene group wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), a C6 to C10 cycloalkylene group, or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are independently a single bond, a substituted or unsubstituted C1 to C30 alkylene group, a substituted or unsubstituted C2 to C30 alkenylene group, a substituted or unsubstituted C2 to C30 alkylene group or a substituted or unsubstituted C3 to C30 alkenylene group wherein at least one methylene (—$CH_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R'_a$ to $R'_d$ are independently $R^2$ or X as defined in Chemical Formula 2, provided that at least two of $R'_a$ to $R'_d$ are X as defined in Chemical Formula 2.

The unsaturated compound may include a compound of Chemical Formula 2-4, a compound of Chemical Formula 2-5, a compound of Chemical Formula 2-6, a compound of Chemical Formula 2-7, a compound of Chemical Formula 2-8, a compound of Chemical Formula 2-9, a compound of Chemical Formula 2-10, a compound of Chemical Formula 2-11, a compound of Chemical Formula 2-12, a compound of Chemical Formula 2-13, a compound of Chemical Formula 2-14, a compound of Chemical Formula 2-15, or a combination thereof:

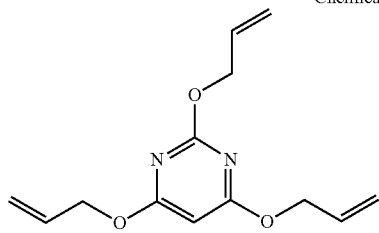

Chemical Formula 2-4

Chemical Formula 2-5

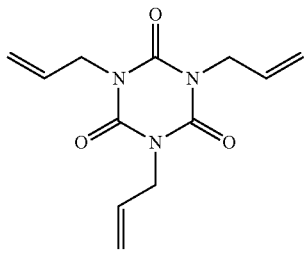

Chemical Formula 2-6

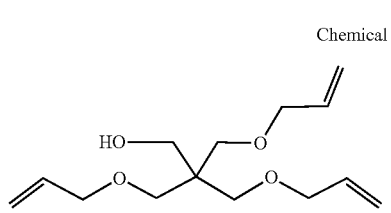

Chemical Formula 2-7

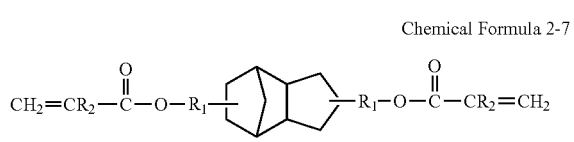

wherein, in Chemical Formula 2-7, $R_1$ is a C1 to C20 alkylene group, or a C2 to C20 alkylene group wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-8

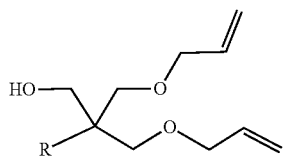

wherein, in Chemical Formula 2-8, R is a C1 to C10 alkyl group;

Chemical Formula 2-9

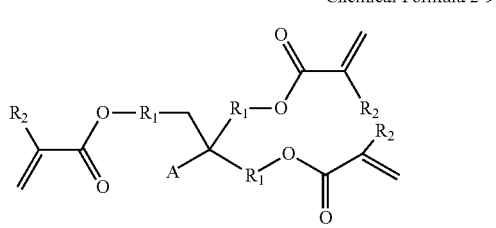

wherein, in Chemical Formula 2-9, A is hydrogen, a C1 to C10 alkyl group, or a hydroxy group, $R_1$ is a direct bond (single bond), a C1 to C20 alkylene group, or a C2 to C20 alkylene wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-10

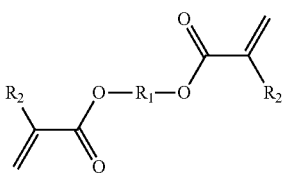

wherein, in Chemical Formula 2-10, $R_1$ is a single bond, a C1 to C20 alkylene, or a C1 to C20 alkylene wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and $R_2$ is hydrogen or a methyl group;

Chemical Formula 2-11

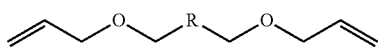

wherein, in Chemical Formula 2-11, R is a bond, a C1 to C20 alkylene, or a C2 to C20 alkylene wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, and Chemical Formula 2-12

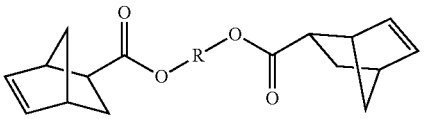

wherein, in Chemical Formula 2-12, R is a C1 to C20 alkylene, or a C1 to C20 alkylene wherein at least one methylene (—CH$_2$—) is replaced by a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—, wherein R is hydrogen or a C1 to C10 linear or branched alkyl group), an imine group (—NR—, wherein R is hydrogen or a C1 to C10 linear or branched alkyl group), or a combination thereof, Chemical Formula 2-13

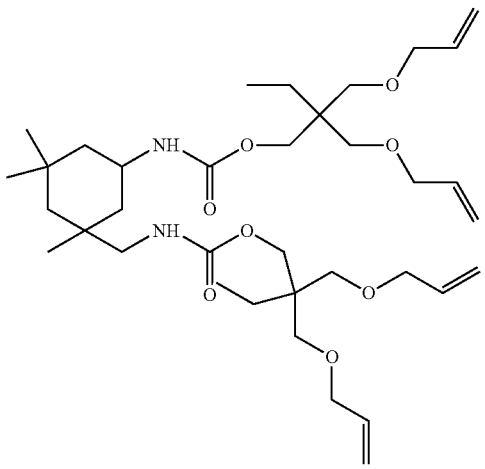

Chemcial Formula 2-14

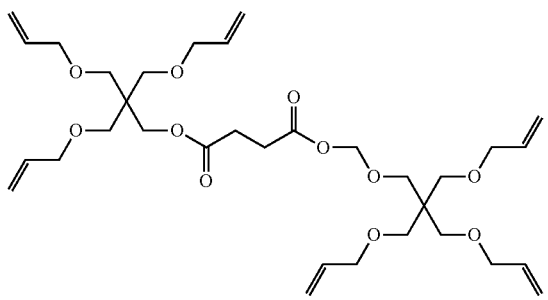

Chemical Formula 2-15

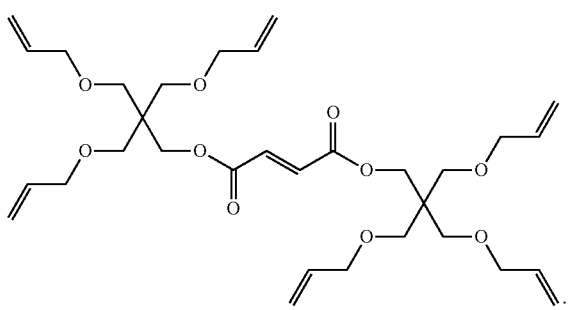

In an embodiment, the unsaturated compound may include a di(meth)acrylate compound, a tri(meth)acrylate compound, a tetra(meth)acrylate compound, a penta(meth)acrylate compound, a hexa(meth)acrylate compound, or a combination thereof.

The polymer layer may not include an unsaturated carboxylic acid, a saturated carboxylic acid, a polymer thereof, or a combination thereof. For example the polymer layer may not include (meth)acrylic acid, benzoic acid, 3-butenoic acid, crotonic acid, butyric acid, isobutyric acid, acetic acid, a polymer thereof, or a combination thereof.

The polymer layer may not include an epoxy moiety or azacyclopropane moiety. For example, the polymer layer may not include a polyethyleneimine moiety.

Another embodiment provides a method of manufacturing the aforementioned luminescent device. The manufacturing method may include preparing an organic solution including the plurality of quantum dots having the first organic ligand and the metal carboxylate in an organic solvent; and coating or depositing the organic solution on the first electrode or second electrode to form an emission layer.

In an embodiment, the preparing of the organic solution may include contacting the plurality of quantum dots having the first organic ligand with the metal carboxylate in an organic solvent.

The preparing of the organic solution may further include separating the plurality of quantum dots (e.g., through a precipitation using a nonsolvent) after they are contacted with the metal carboxylate. The resulting quantum dots after the separation may include the first organic ligand and the metal carboxylate and may be redispersed in an organic solvent that will be described below, providing the organic solution. In this case, the organic solution may include substantially none of a second organic solvent which will be described below.

In an embodiment, the preparing of the organic solution may be performed without the aforementioned separation. In this case, the organic solution may include the second organic solvent which will be described below. Details for the quantum dot, the metal carboxylate, and the first organic ligand are the same as described above.

The contacting of the quantum dots having the first organic ligand on the surface thereof with the metal carboxylate may include dispersing the quantum dots in the first organic solvent to obtain a quantum dot dispersion, dispersing the metal carboxylate in the second organic solvent to obtain a metal carboxylate solution, and combining (e.g., mixing) the quantum dot dispersion with the metal carboxylate solution.

The first organic solvent is an organic solvent capable of dispersing quantum dots and may be selected appropriately (e.g., considering the first organic ligand). In an embodiment, the organic solvent may include, for example, a substituted or unsubstituted aliphatic hydrocarbon organic solvent such as octane, nonane, or a combination thereof, for example, a substituted or unsubstituted aromatic hydrocarbon organic solvent such as toluene, chlorobenzene, an acetate solvent, or a combination thereof.

The second organic solvent is a solvent that is miscible with the first solvent and dissolves the metal carboxylate. The second organic solvent may include a linear or branched C1 to C7 alcohol, such as methanol, ethanol, propanol, isopropanol, butanol, pentenol, hexanol, or heptanol, or a combination thereof. The second organic solvent may be a nonsolvent for the quantum dots. The nonsolvent may be a solvent that induces precipitation of quantum dots when it is present in excess.

Accordingly, when the second organic solvent is present in the organic solution, a volume ratio between the first organic solvent and the second organic solvent (first organic solvent:second organic solvent) may be less than or equal to about 1:0.5, for example, less than or equal to about 0.4, less than or equal to about 0.3, less than or equal to about 0.2, less than or equal to about 0.1, less than or equal to about 0.09, less than or equal to about 0.08, less than or equal to about 0.07, less than or equal to about 0.06, or less than or equal to about 0.05. When the second organic solvent is present in the organic solution, the volume ratio between the first organic solvent and the second organic solvent (first organic solvent:second organic solvent) may be greater than or equal to about 1:0.001, greater than or equal to about 0.002, greater than or equal to about 0.003, greater than or equal to about 0.004, greater than or equal to about 0.005, greater than or equal to about 0.006, greater than or equal to about 0.007, greater than or equal to about 0.008, greater than or equal to about 0.009, greater than or equal to about 0.01, greater than or equal to about 0.015, greater than or equal to about 0.02, greater than or equal to about 0.025, greater than or equal to about 0.03, greater than or equal to about 0.035, greater than or equal to about 0.04, or greater than or equal to about 0.045.

In the contacting of the quantum dots having the first organic ligand on the surface with the metal carboxylate, a use amount of the metal carboxylate relative to the quantum dots may be selected appropriately considering a content of the metal carboxylate relative to the quantum dots, a content of the quantum dot in a solution. For example, in the contacting of the quantum dots having the first organic ligand on the surface with the metal carboxylate, a use amount of the metal carboxylate relative to the quantum dots may be greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, or greater than or equal to about 10 wt % based on a total weight of the quantum dots. In the contacting, a use amount of the metal carboxylate relative to the quantum dots may be less than or equal to about 50 wt %, less than or equal to about 40 wt %, less than or equal to about 30 wt %, less than or equal to about 20 wt %, or less than or equal to about 15 wt % based on a total weight of the quantum dots.

The coating or deposition may be performed using a suitable method (e.g., spin-coating, inkjet-printing, and the like). The coated or deposited quantum dot layer may be, if necessary, heat-treated (e.g., to remove solvents). A temperature of the heat-treatment is not particularly limited but may be selected appropriately by considering a boiling point and the like of the organic solvent. For example, the temperature of the heat-treatment may be greater than or equal to about 60° C.

The method may further include forming the other electrodes (e.g., a second electrode or a first electrode) and optionally, forming a charge auxiliary layer on the emission layer. For example, the method may further include, if necessary, forming the charge auxiliary layer (e.g., a hole auxiliary layer) on the first electrode before forming the emission layer on the first electrode. Herein, the emission layer may be formed on the charge auxiliary layer disposed on the first electrode.

In an embodiment, the emission layer may be disposed on the first electrode, and the method may further include forming an electron auxiliary layer on the emission layer; and forming a polymer layer on the electron auxiliary layer. The polymer layer may be the same as described above. In an embodiment, a light emitting device including the polymer layer may be heated at an appropriate temperature (e.g., at greater than or equal to about 50° C.). The heat-treatment may be performed under an appropriate atmosphere (e.g., a nonoxygen atmosphere or an inert gas atmosphere such as argon, nitrogen, and the like).

The first electrode, the emission layer, the charge (hole, electron) auxiliary layer, the second electrode, and the polymer layer may be the same as described above.

The forming of the electrode and the charge auxiliary layer may be performed in a solution process, a deposition process, or a combination thereof. A method of forming the electrode and the charge auxiliary layer is not particularly limited but may be selected appropriately by considering materials of the electrode and the charge auxiliary layer.

An embodiment may provide an electronic device including the aforementioned luminescent device. The electronic device may be applied to various electronic devices such as display devices or lighting devices.

Hereinafter, the embodiments are illustrated in more detail with reference to examples. However, these examples are exemplary, and the present scope is not limited thereto.

EXAMPLES

Analysis Methods
1. Fourier-Transform Infrared (FT IR) Analysis
An infrared spectroscopy is performed using a Varian 670-IR instrument.
2. Electroluminescence Spectroscopy
The manufactured light emitting device is evaluated for an electroluminescence property using a Keithley 2200 source measurement equipment and a Minolta CS2000 spectroradiometer (current-voltage-luminance measurement equipment). The current, luminance, electroluminescence (EL) depending upon a voltage applied to the device is measured by the current-voltage-luminance measurement equipment, and thereby an external quantum efficiency is also calculated.
3. Life-Span Characteristics
T50 (h): at the operation of the device at 100 nits (candela per square meter ($cd/m^2$)), time taken for which the luminance of the device is reduced to 50% of its initial value (100%).
T95 (h): at the operation of the device at 100 nits ($cd/m^2$), time taken for which the luminance of the device is reduced to 95% of its initial value (100%).

Reference Example 1-1: Preparation of Blue Light Emitting Quantum Dots (1) Selenium (Se) and tellurium (Te) are dispersed in trioctylphosphine (TOP) to obtain a Se/TOP stock solution and Te/TOP stock solution. In a reactor including trioctylamine, 0.125 millimoles (mmol) of zinc acetate is added together with oleic acid and heated to 120° C. under vacuum. After 1 hour, the atmosphere in the reactor is converted into nitrogen.

Subsequently, the reactor is heated up to 300° C., the prepared Se/TOP stock solution and Te/TOP stock solution are rapidly injected thereinto in a Te/Se ratio of 1/25. After the reaction is completed, acetone is added to the reaction solution that is rapidly cooled to room temperature, and a precipitate obtained by centrifugation is dispersed in toluene to obtain ZnTeSe quantum dots.

(2) 1.8 mmol (0.336 grams (g)) of zinc acetate along with oleic acid is put in a flask containing trioctylamine and vacuum-treated at 120° C. for 10 minutes. After the flask is internally substituted with nitrogen ($N_2$), the temperature is increased to 180° C. Subsequently, the ZnTeSe core obtained in Synthesis Example 1 is added thereto, and Se/TOP and S/TOP are injected thereinto. The reaction temperature is set at about 280° C. When the reaction is all complete, the reactor is cooled down, ethanol is added to the reaction solution for a precipitation, and precipitates obtained therefrom are centrifuged to obtain ZnTeSe/ZnSeS core/shell quantum dots.

Reference Example 2: Synthesis of Zn Metal Oxide Nanoparticles

Zinc acetate dihydrate and magnesium acetate tetrahydrate are added into a reactor including dimethylsulfoxide to provide a mole ratio shown in the following chemical formula and heated at 60° C. under air. Subsequently, an ethanol solution of tetramethylammonium hydroxide pentahydrate is added into the reactor in a dropwise fashion at a speed of 3 milliliters (mL) per minute. After stirring the same, the obtained $Zn_xMg_{1-x}O$ nanoparticles are centrifuged and dispersed in ethanol to provide $Zn_xMg_{1-x}O$ nanoparticles. (x=0.85)

The obtained nanoparticles are performed with an X-ray diffraction analysis, so it is confirmed that a ZnO crystal is formed. The obtained nanoparticles are performed with a transmission electron microscopic analysis, and the results show that the particles have an average size of about 3 nm.

Energy bandgap of the obtained nanoparticles is measured and monitored by a ultraviolet (UV) band edge tangent line (UV-2600, SHIMADZU). The results show that the synthesized $Zn_xMg_{1-x}O$ nanoparticles have energy bandgap of about 3.52 eV to about 3.70 eV.

Example 1

1. Preparation of Quantum Dot Organic Solution

The quantum dots prepared in Reference Example 1 are dispersed in octane to obtain quantum dot dispersion. Zinc acetate is dissolved in ethanol to obtain a zinc acetate ethanol solution. The quantum dot dispersion is mixed with the ethanol solution at room temperature to obtain a mixed solution. The obtained mixed solution has higher transparency than the quantum dot dispersion. A content of the zinc acetate relative to that of the quantum dots is 10 wt %, and in the mixed solution, a volume ratio of octane:ethanol is 19:1.

An excessive amount of ethanol is added to the obtained mixed solution to derive a precipitation, and precipitates therein are centrifuged to obtain the quantum dots combined with the zinc acetate.

The obtained quantum dots combined with the zinc acetate are dispersed in octane to obtain a quantum dot organic solution (Optical Density (OD): 2.4).

2. Manufacture of Device

A device having ITO/PEDOT:PSS (30 nm)/TFB (25 nm)/QD emission layer (25 nm)/NET430:NDN77 organic ETL (20 nm)/Al (100 nm) is manufactured in the following method.

Indium tin oxide (ITO) (an anode) is deposited on a substrate, and a poly(3,4-ethylenedioxythiophene) polystyrene sulfonate (PEDOT:PSS) layer and a poly(9,9-dioctylfluorene-co-N-(4-butylphenyl)-diphenylamine) (TFB) layer as a hole injection layer (HIL) and a hole transport layer (HTL) are formed thereon using a wet coating method.

On the HTL layer, the quantum dot organic solution is spin-coated and dried at 80° C. to remove the solvent to form an emission layer.

Figure 5:
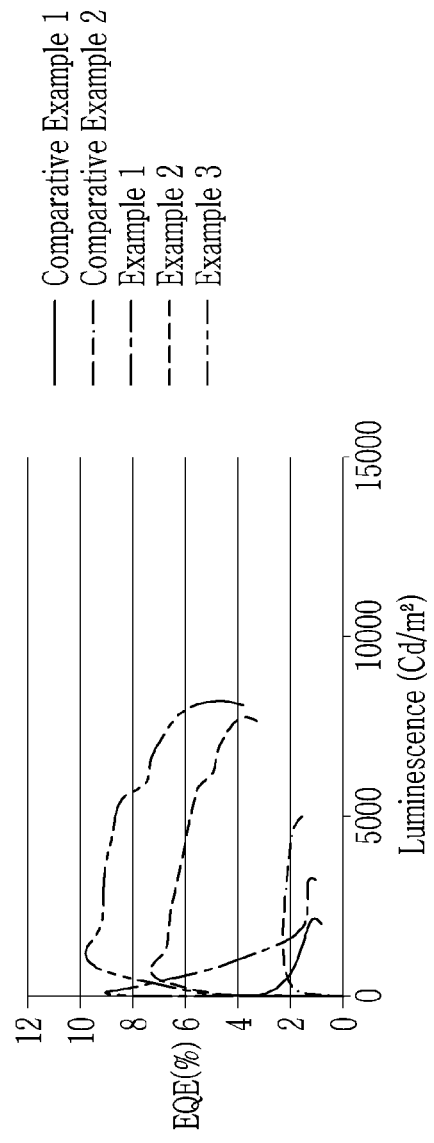
FIG. 5 is a graph of external quantum efficiency (%) versus luminescence (candela per square meter, ($Cd/m^2$)) showing electroluminescence properties of the devices manufactured according to Comparative Examples 1 and 2, and Examples 1, 2, and 3.

NET430:NDN77 is formed into an electron auxiliary layer on the emission layer in a vacuum thermal evaporation process. On the formed electron auxiliary layer, an Al electrode (a cathode) is deposited. Electroluminescence properties and life-span characteristics of a device manufactured therefrom are shown in Table 1 and FIG. 5.

Experimental Example 1

Figure 6:
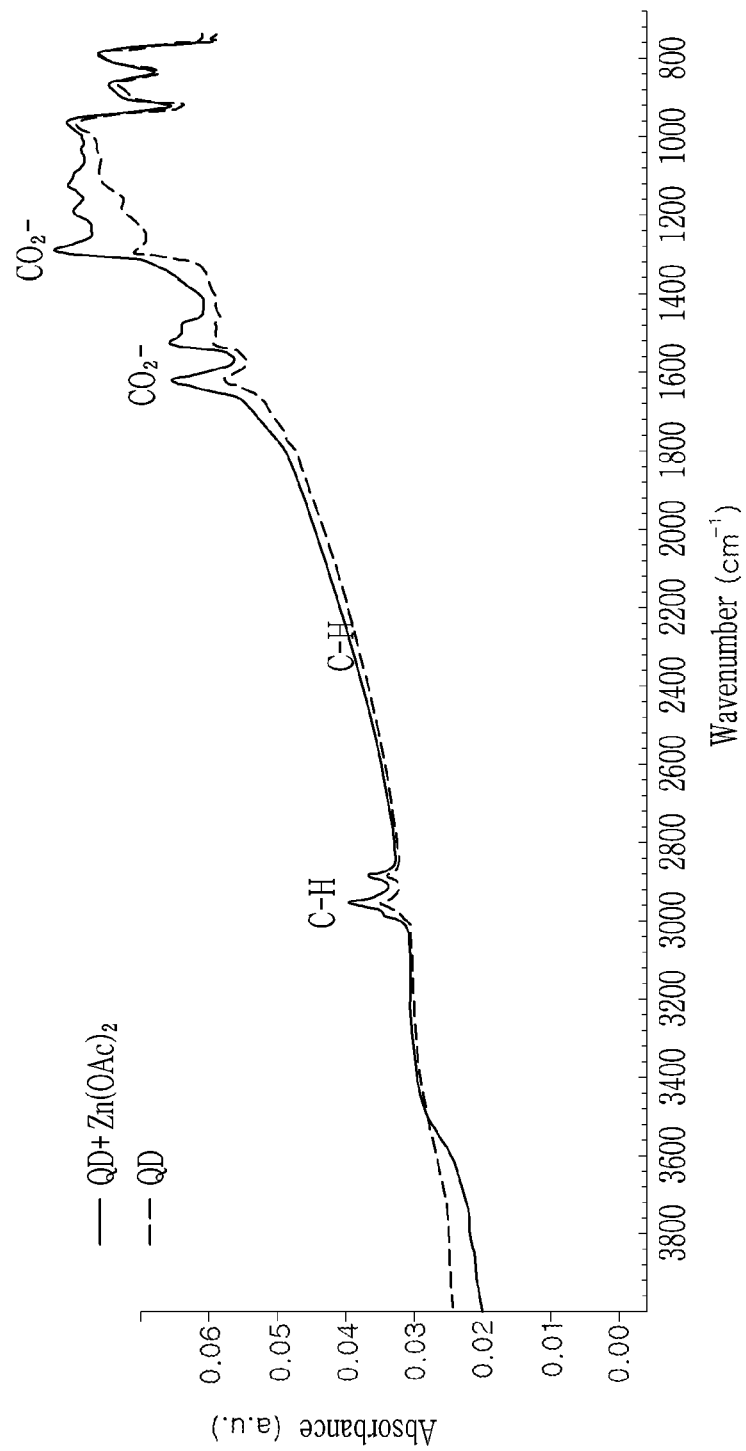
FIG. 6 shows an infrared ray spectroscopic analysis (absorbance (a.u.) vs. wavelength ($cm^{-1}$)) of the quantum dots prepared in Reference Example 1 and in Example 1.

An infrared ray spectroscopic analysis of the quantum dots prepared in Reference Example 1 and prepared in Example is performed, and the result is shown in FIG. 6.

Results of FIG. 6 confirm that the zinc acetate-treated quantum dots show greatly increased C—H and $CO_2$— peaks compared with the quantum dots prepared in Reference Example 1. This result implies that the zinc acetate is evenly dispersed or bound in a quantum dot layer.

Example 2

A light emitting device is manufactured in the same method as Example 1 except that instead of the organic electron auxiliary layer, a solution (a solvent: ethanol) of the ZnMgO nanoparticles obtained in Reference Example 2 is coated to have a thickness of 30 to 35 nm.

Electroluminescence properties and life-span characteristics of the manufactured device are measured and the results are shown in Table 1.

Example 3

0.1 g of a monomer mixture including an ene monomer having 2 acrylates and alicyclic main moiety and a multiple thiol compound represented by the following chemical formula at a mole ratio of 22:78 is prepared on a device on which Al electrode is deposited.

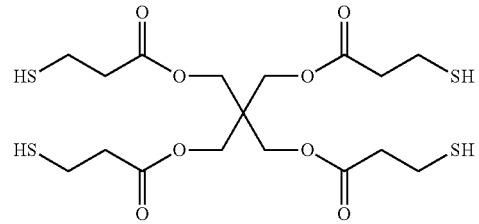 [SMILES: O=C(CCS)OCC(COC(=O)CCS)(COC(=O)CCS)COC(=O)CCS]

The prepared mixture is coated on the aluminum electrode and the electron transport layer (ETL) surface of the obtained device to provide a polymer precursor layer. A cover glass is disposed on the polymer precursor layer and pressed, and then the monomer mixture is polymerized for about 5 minutes under a state that the device formed with the polymer precursor layer is heated by irradiating UV light (wavelength: 365 nm, intensity: 600 millijoule per square centimeter ($mJ/cm^2$)) to provide a light emitting device formed with a polymer layer.

Electroluminescence properties and life-span characteristics of the manufactured device are measured and the results are shown in Table 1.

Comparative Example 1

A light emitting device is manufactured according to the same method as Example 1 except that instead of the quantum dots combined with zinc acetate in octane, a solution (OD: 2.4) prepared by dispersing the quantum dots prepared in Reference Example 1 is spin-coated.

Electroluminescence properties and life-span characteristics of the manufactured device are measured and the results are shown in Table 1.

Comparative Example 2

A light emitting device is manufactured according to the same method as Example 2 except that a solution (OD: 2.4) prepared by dispersing the quantum dots prepared in Reference Example 1 instead of the mixture of the zinc acetate and the quantum dots in octane is spin-coated.

Electroluminescence properties and life-span characteristics of the manufactured device are measured and the results are shown in Table 1.

Comparative Example 3

A light emitting device is manufactured according to the same method as Example 3 except that a solution (OD: 2.4) prepared by dispersing the quantum dots prepared in Reference Example 1 instead of the mixture of the zinc acetate and the quantum dots in octane is spin-coated.

Electroluminescence properties and life-span characteristics of the manufactured device are measured and the results are shown in Table 1.

TABLE 1

| | Description | Max. EQE | Max. Cd/A | Lambda max. (λ) | FWHM (nm) | Max. Lum | T(95) | T(50) |
|---|---|---|---|---|---|---|---|---|
| Example 1 | Blue OA + Zn(OAc)$_2$/OETL | 7.4 | 5.1 | 455 | 26 | 1940 | 0.01 | 1.0 |
| Comparative Example 1 | Blue OA/OETL | 2.5 | 1.4 | 455 | 26 | 1600 | 0.01 | 0.6 |
| Example 2 | Blue OA + Zn(OAc)$_2$/ZnMgO | 7.5 | 4.5 | 455 | 26 | 5870 | 0.04 | 2.7 |
| Comparative Example 2 | Blue OA/ZnMgO | 2.3 | 1.1 | 454 | 25 | 5030 | 0.04 | 1.6 |
| Example 3 | Blue OA + Zn(OAc)$_2$/ ZnMgO/polymer layer | 16 | 9.3 | 455 | 26 | 16690 | 2.83 | 26.2 |
| Comparative Example 3 | Blue OA/ZnMgO/polymer layer | 13.5 | 7.1 | 455 | 26 | 14320 | 0.8 | 10 |

* Max. EQE: maximum external quantum efficiency
* Max. Cd/A: maximum current efficiency candelas per ampere
* T95 (h): on driving at 100 nit, time (hr) for gaining the luminance of 95% with respect to 100% of luminance
* T50 (h): on driving at 100 nit, time (hr) for gaining the luminance of 50% with respect to 100% of luminance
* Lambda max. and FWHM: EL peak wavelength and full width at half maximum (FWHM)
* Max. Lum: maximum luminance From the results of Table 1 and FIG. 4, it is confirmed that the luminescent devices according to Examples 1, 2, and 3 exhibit greatly improved electroluminescence properties and extended life-span characteristics comparing to the luminescent devices according to Comparative Examples 1, 2, and 3.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

Description of Symbols

10: luminescent device
11: first electrode
12: hole auxiliary layer
13: emission layer
14: electron auxiliary layer
15: second electrode

What is claimed is:

1. A light emitting device, comprising
a first electrode and a second electrode facing each other, and
an emission layer disposed between the first electrode and the second electrode, wherein the emission layer comprises a plurality of quantum dots and a metal carboxylate comprising at least one hydrocarbon group having at least one carbon atom, and
the quantum dots do not comprise cadmium, lead, or a combination thereof,
wherein the light emitting device comprises an electron auxiliary layer disposed between the emission layer and the second electrode, and the electron auxiliary layer comprises a nanoparticle comprising a zinc metal oxide.

2. The light emitting device of claim 1, wherein the plurality of quantum dots comprises a first organic ligand, and optionally, wherein the first organic ligand comprises RCOOH, RNH$_2$, R$_2$NH, R$_3$N, R$_3$PO, R$_3$P, ROH, RCOOR, RPO(OH)$_2$, RHPOOH, R$_2$POOH, or a combination thereof, wherein, R is independently a C3 to C40 substituted or unsubstituted aliphatic hydrocarbon group, a C6 to C40 substituted or unsubstituted aromatic hydrocarbon group, or a combination thereof.

3. The light emitting device of claim 2, wherein the first organic ligand comprises a carboxylic acid compound having 10 carbon atoms or more.

4. The light emitting device of claim 2, wherein a content of the first organic ligand is greater than or equal to about 1 weight % based on a total weight of the quantum dots.

5. The light emitting device of claim 1, wherein the plurality of quantum dots emits blue light.

6. The light emitting device of claim 1, wherein the metal carboxylate comprises zinc, magnesium, aluminum, calcium, sodium, yttrium, indium, or titanium.

7. The light emitting device of claim 1, wherein the metal carboxylate comprises a compound represented by M(RCOO)$_n$, wherein, R is a C1 or more and C30 or less aliphatic hydrocarbon group,
M is zinc, magnesium, calcium, or indium, and
n is a valence of the metal M.

8. The light emitting device of claim 1, wherein the metal carboxylate comprises zinc acetate, zinc propionate, zinc octanoate, zinc oleate, zinc lactate, or a combination thereof.

9. The light emitting device of claim 1, wherein the emission layer comprises the metal carboxylate in an amount of greater than or equal to about 0.1 weight % based on a total weight of the plurality of quantum dots.

10. The light emitting device of claim 1, wherein the zinc metal oxide is represented by Chemical Formula 1:

Chemical Formula 1

$$Zn_{1-x}M_xO$$

wherein, in Chemical Formula 1,
M is Mg, Ca, Zr, W, Li, Ti, Y, Al, or a combination thereof, and $$0 \leq x \leq 0.5.$$

11. The light emitting device of claim 1, wherein the electron auxiliary layer contacts the emission layer and the electrode.

12. The light emitting device of claim 1, wherein
the second electrode has a first surface facing the emission layer and a second surface opposed to the first surface,
the light emitting device comprises a polymer layer disposed on the second surface, and
the polymer layer comprises a polymerization product of a monomer combination comprising an unsaturated compound having two or more carbon-carbon unsaturated bonds.

13. The light emitting device of claim 12, wherein the monomer combination further comprises a multiple thiol compound comprising at least two thiol groups, a monothiol compound having one thiol group, or a combination thereof.

14. The light emitting device of claim 12, wherein the unsaturated compound does not comprise a carboxylic acid group.

15. The light emitting device of claim 1, wherein the light emitting device has maximum external quantum efficiency of greater than or equal to about 3%, or wherein the light emitting device has a T50 of greater than or equal to about 20 hours, wherein the T50 is a time taken for which the luminance of the light emitting device is reduce to 50% of an initial value when the light emitting device is operated at 100 cd/m$^2$.

16. A method of manufacturing the light emitting device of claim 1, comprising preparing an organic solution comprising the plurality of quantum dots and the metal carboxylate in an organic solvent;
coating the organic solution on the first electrode or the second electrode to provide an emission layer disposed between the first electrode and the second electrode; and
forming an electron auxiliary layer disposed between the emission layer and the second electrode, wherein the electron auxiliary layer comprises a nanoparticle comprising a zinc metal oxide.

17. The method of claim 16, wherein the organic solvent comprises a first solvent of octane, cyclohexane, or a combination thereof, and a C1 to C7 alcohol mixable with the first solvent.

18. The method of claim 16, wherein
the emission layer is disposed on the first electrode, and and
forming a polymer layer on the electron auxiliary layer.

19. A light emitting device, comprising
a first electrode and a second electrode facing each other, and
an emission later disposed between the first electrode and the second electrode, wherein the emission layer comprises a plurality of quantum dots and a metal carboxylate comprising at least one hydrocarbon group having at least one carbon atom, and the quantum dots do not comprise cadmium, lead, or a combination thereof,
wherein the plurality of quantum dots do not comprise an organic thiol-containing compound bound to a surface of the plurality of quantum dots, wherein the organic thiol-containing compound is butanethiol, pentanethiol, hexanethiol, heptanethiol, octanethiol, nonanethiol, decanethiol, undecanethiol, dodecanethiol, or octadecanethiol.

20. The light emitting device of claim 19, wherein the light emitting device comprises an electron auxiliary layer disposed between the emission layer and the second electrode, and the electron auxiliary layer comprises a nanoparticle comprising a zinc metal oxide, and optionally, wherein the zinc metal oxide further comprises magnesium.

21. The light emitting device of claim 19, wherein the light emitting device has a maximum external quantum efficiency of greater than or equal to about 3% or,
wherein the light emitting device has a T50 of greater than or equal to about 20 hours, wherein the T50 is a time taken for which the luminance of the light emitting device is reduced to 50% of an initial value when the light emitting device is operated at 100 cd/m$^2$.

* * * * *